(12) United States Patent
Morikawa et al.

(10) Patent No.: US 9,666,463 B2
(45) Date of Patent: May 30, 2017

(54) SUBSTRATE PROCESSING APPARATUS

(71) Applicant: Tokyo Electron Limited, Tokyo (JP)

(72) Inventors: Katsuhiro Morikawa, Koshi (JP); Issei Ueda, Koshi (JP); Akira Murata, Koshi (JP); Junya Minamida, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 19 days.

(21) Appl. No.: 14/580,703

(22) Filed: Dec. 23, 2014

(65) Prior Publication Data

US 2015/0187621 A1    Jul. 2, 2015

(30) Foreign Application Priority Data

Dec. 27, 2013 (JP) .................................. 2013-273035

(51) Int. Cl.
*H01L 21/677* (2006.01)
*H01L 21/67* (2006.01)

(52) U.S. Cl.
CPC .. *H01L 21/67742* (2013.01); *H01L 21/67178* (2013.01); *H01L 21/67754* (2013.01); *H01L 21/67757* (2013.01)

(58) Field of Classification Search
CPC ...... B25J 9/1674; B25J 15/0057; B25J 19/06; G05B 19/406; G05B 19/4062; G05B 19/4065; G05B 2219/24033; H01L 21/6719; H01L 21/67178; H01L 21/67742; H01L 21/67751; H01L 21/67754; H01L 21/67757

USPC ......... 414/222.02, 222.07, 935; 700/21, 177, 700/256
See application file for complete search history.

(56) References Cited

U.S. PATENT DOCUMENTS

| 8,267,634 | B2* | 9/2012 | Bufano | ............. H01L 21/67017 104/281 |
| 8,911,193 | B2* | 12/2014 | Rice | ................. H01L 21/67745 414/222.13 |
| 2015/0112481 | A1* | 4/2015 | Burns | .................... B25J 9/1674 700/248 |

FOREIGN PATENT DOCUMENTS

| JP | 2009-008227 A | 1/2009 |
| JP | 2011-082279 A | 4/2011 |
| JP | 2013-069874 A | 4/2013 |
| JP | 2013-162111 A | 8/2013 |

\* cited by examiner

*Primary Examiner* — Michael McCullough
*Assistant Examiner* — Brendan Tighe
(74) *Attorney, Agent, or Firm* — Pearne & Gordon LLP

(57) ABSTRACT

A throughput can be improved. A substrate processing apparatus includes processing units arranged in a vertical direction and configured to process substrates; and a substrate transfer device configured to be moved in the vertical direction and perform loading/unloading of the substrates into/from the processing units. Further, the substrate transfer device comprises a first transfer arm and a second transfer arm which are arranged in the vertical direction and configured to be moved in the vertical direction independently, and movement ranges of the first transfer arm and the second transfer arm in the vertical direction are overlapped with each other.

6 Claims, 7 Drawing Sheets

SUBSTRATE PROCESSING APPARATUS

CROSS-REFERENCE TO RELATED APPLICATION

This application claims the benefit of Japanese Patent Application No. 2013-273035 filed on Dec. 27, 2013, the entire disclosures of which are incorporated herein by reference.

TECHNICAL FIELD

The embodiments described herein pertain generally to a substrate processing apparatus.

BACKGROUND

Conventionally, there is known a substrate processing apparatus that performs various processes such as a cleaning or a film formation on a substrate such, e.g., a semiconductor wafer or a glass substrate.

As an example, Patent Document 1 describes a substrate processing apparatus including a multiple number of liquid processing units vertically arranged in two levels; an upper transfer arm configured to load or unload a substrate into/from upper processing units; and a lower transfer arm configured to load or unload a substrate into/from lower processing units.

Patent Document 1: Japanese Patent Laid-open Publication No. 2011-082279

The technique described in Patent document 1, however, is required to improve a throughput.

For example, in the substrate processing apparatus described in Patent Document 1, a movement range of the upper transfer arm is limited within the height range of the upper processing units, and, likewise, a movement range of the lower transfer arm is limited within the height range of the lower processing units. Thus, when a problem occurs in the upper transfer arm, for example, all of the upper processing units cannot be used, so that the throughput may be deteriorated.

SUMMARY

In view of the foregoing problem, example embodiments provide a substrate processing apparatus capable of improving a throughput.

In one example embodiment, a substrate processing apparatus includes processing units arranged in a vertical direction and configured to process substrates; and a substrate transfer device configured to be moved in the vertical direction and perform loading/unloading of the substrates into/from the processing units. Further, the substrate transfer device comprises a first transfer arm and a second transfer arm which are arranged in the vertical direction and configured to be moved in the vertical direction independently, and movement ranges of the first transfer arm and the second transfer arm in the vertical direction are overlapped with each other.

According to the example embodiments, the throughput can be improved.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
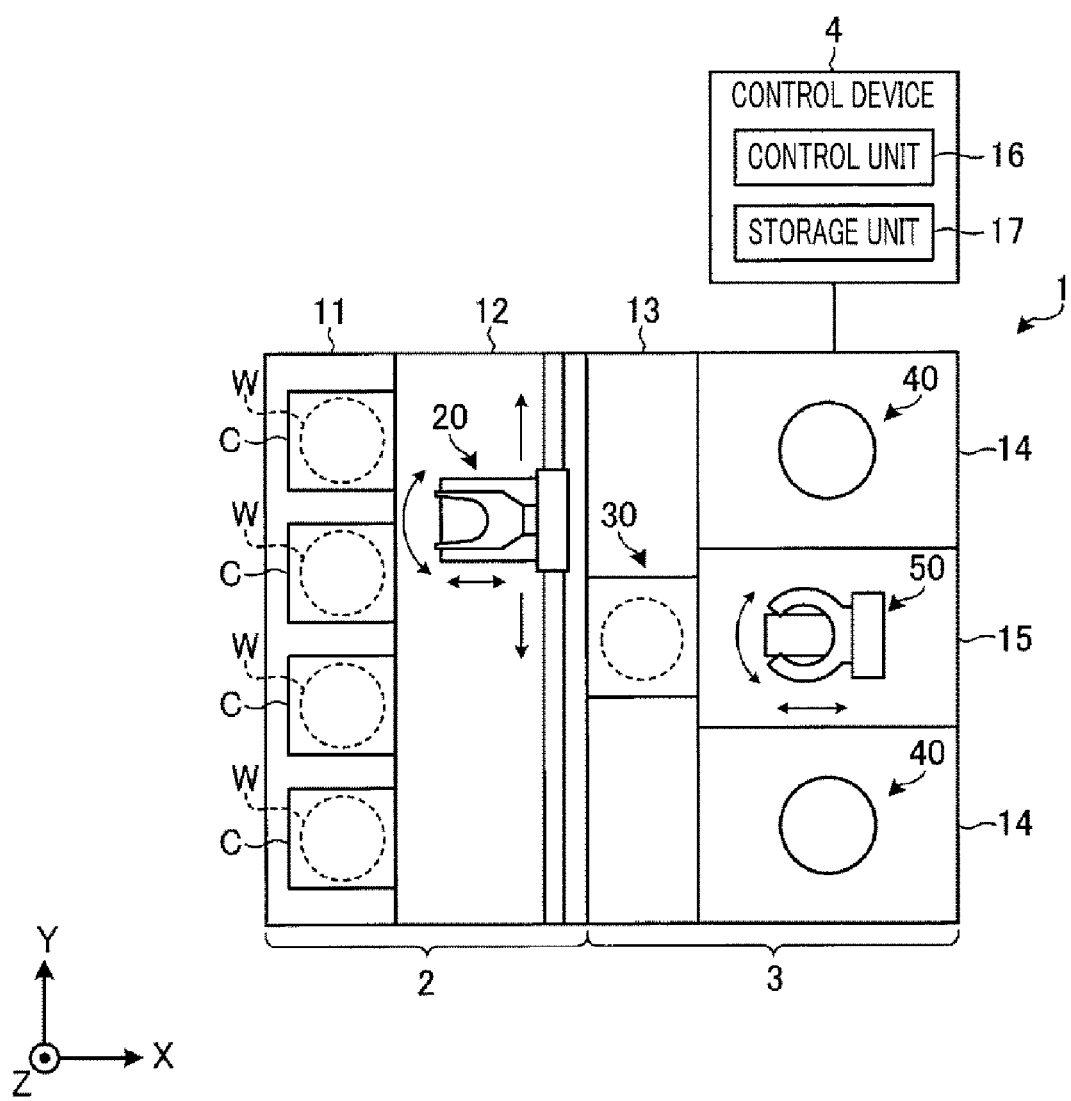
FIG. 1 is a schematic plane view illustrating a configuration of a substrate processing apparatus in accordance with an example embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current example embodiment. Still, the example embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, a substrate processing apparatus in accordance with an example embodiment will be described in detail with reference to the accompanying drawings, which form a part of the description. However, it should be noted that the example embodiment is not limiting.

FIG. 1 is a schematic plane view illustrating a configuration of a substrate processing apparatus in accordance with an example embodiment. Hereinafter, to clarify positional relationship, X, Y and Z axes orthogonal to each other are defined, and a positive Z-axis direction is set as a vertically upward direction.

As depicted in FIG. 1, a substrate processing apparatus 1 includes a loading/unloading block 2 and a processing block 3.

The loading/unloading block 2 includes a mounting station 11 and a first transfer section 12. The mounting station 11 mounts thereon multiple cassettes C, each of which accommodates therein a multiple number of semiconductor wafers (hereinafter, simply referred to as "wafers W") in a horizontal posture.

The first transfer section 12 is provided adjacent to the mounting station 11. A first transfer device 20 is provided within the first transfer section 12. The first transfer device 20 is configured to transfer a wafer W between the cassette C and an accommodation unit 30 of the processing block 3 to be described later.

The processing block 3 includes a transit station 13, two processing stations 14 and a second transfer section 15.

The transit station 13 is provided adjacent to the first transfer section 12 of the loading/unloading block 2. The accommodation unit 30 configured to accommodate the wafers W therein is provided in this transit station 13.

The second transfer section 15 is provided adjacent to the accommodation unit 30 of the transit station 13. The two processing stations 14 are provided adjacent to the second transfer section 15 in a positive Y-axis direction and a negative Y-axis direction, respectively.

A multiplicity of processing units 40 are vertically arranged in each processing station 14. Each of the multiplicity of processing units 40 is configured to perform a preset substrate process on a wafer W. Here, each processing unit is described to perform a cleaning process on a wafer W by bringing a brush into contact with the wafer W. However, the substrate process performed by each processing unit 40 is not limited to the mentioned example. By way of non-limiting example, each processing unit 40 may be configured to perform a cleaning process using a chemical liquid such as SC1 (mixed liquid of ammonia and hydrogen peroxide water) or a substrate process, such as a film forming process, other than the cleaning process.

A second transfer device 50 is provided within the second transfer section 15. The second transfer device 50 is configured to transfer the wafer W between the accommodation unit 30 and the processing unit 40.

Further, the substrate processing apparatus 1 includes a control device 4. The control device 4 may be implemented by, but not limited to, a computer and includes a control unit 16 and a storage unit 17. The storage unit 17 stores therein programs for controlling various processes performed in the substrate processing apparatus 1. The control unit 16 controls operations of the substrate processing apparatus 1 by executing the programs read out from the storage unit 17.

These programs may be previously stored on a computer-readable storage medium and installed on the storage unit 17 of the control device 4 from the storage medium. The computer-readable storage medium may be, but not limited to, a hard disk (HD), a flexible disk (FD), a compact disk (CD), a magnet optical disk (MO), a memory card, or the like.

Figure 2:
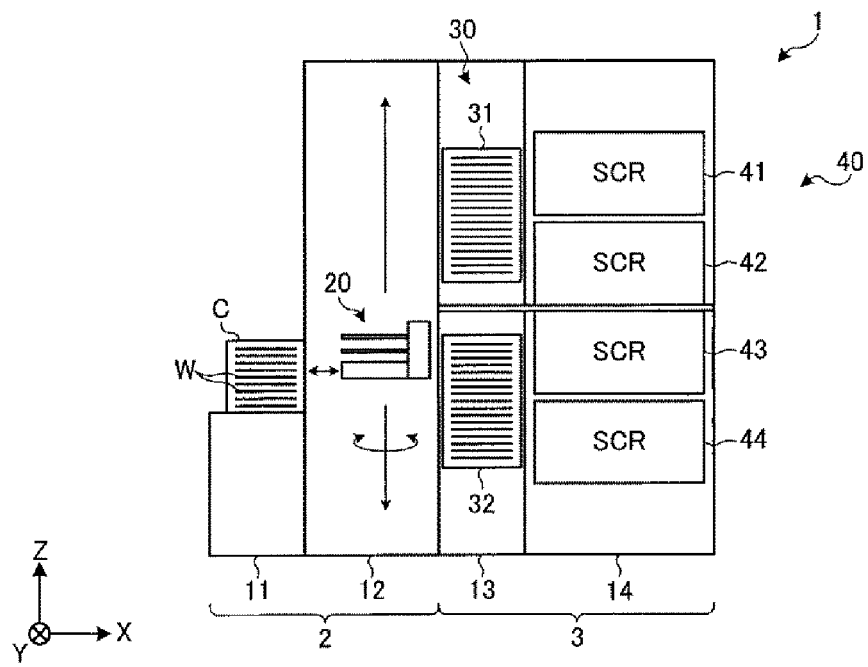
FIG. 2 is a schematic side view illustrating the configuration of the substrate processing apparatus in accordance with the example embodiment.
Figure 3:
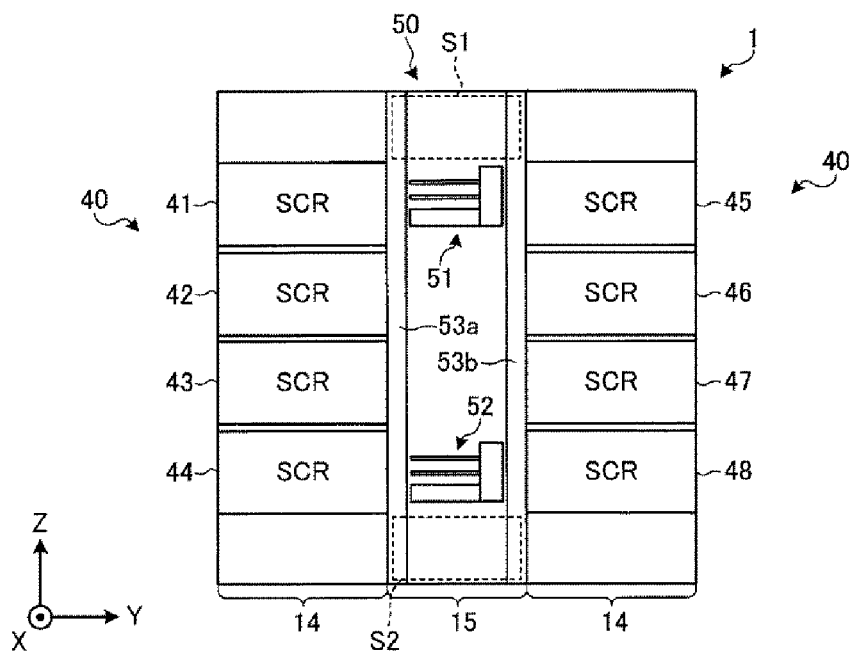
FIG. 3 is a schematic rear view illustrating the configuration of the substrate processing apparatus in accordance with the example embodiment.

Now, a configuration of the processing block 3 will be elaborated with reference to FIG. 2 and FIG. 3. FIG. 2 is a schematic side view illustrating the configuration of the substrate processing apparatus 1 in accordance with the example embodiment, and FIG. 3 is a rear view thereof. In FIG. 2 and FIG. 3, the processing units 40 are named "SCR."

As depicted in FIG. 2, the accommodation unit 30 includes a first accommodation unit 31 and a second accommodation unit 32. The first and second accommodation units 31 and 32 are vertically arranged.

The first transfer device 20 is configured to be moved in a horizontal direction and in a vertical direction and, also, to be rotated about a vertical axis. The first transfer device 20 is configured to transfer the wafer W between the cassette C and the first accommodation unit 31 or the second accommodation unit 32. The transfer device 20 is equipped with a multiple number of (here, two) wafer holders and is thus capable of transferring multiple wafers W at the same time.

Four processing units 40 are stacked on top of each other in the vertical direction. Here, the four processing units 40 include a processing unit 41, a processing unit 42, a processing unit 43 and a processing unit 44 that are arranged in this sequence from the top. Further, processing units 45 to 48, which are the same as the processing units 41 to 44 shown in FIG. 2, are also arranged in the other processing station 14 within the processing block 3 (see FIG. 3). Accordingly, the processing block 3 has a total number of eight processing units 41 to 48.

As depicted in FIG. 3, the second transfer device 50 includes a first transfer arm 51 and a second transfer arm 52. The first transfer arm 51 and the second transfer arm 52 are vertically arranged in this sequence from the top. As stated, the substrate processing apparatus 1 is equipped with the two transfer arms (the first transfer arm 51 and the second transfer arm 52) configured to load and unload wafers W into/from the eight processing units 41 to 48. That is, the total number of the processing units 41 to 48 arranged in the substrate processing apparatus 1 is larger than the total number of the transfer arms provided therein.

The first transfer arm 51 and the second transfer arm 52 are configured to be extended and contracted in the horizontal direction, moved in the vertical direction, and rotated about the vertical axis independently. The first and second transfer arms 51 and 52 are configured to transfer the wafers W between the accommodation unit 30 (the first or second accommodation unit 31 or 32) and the processing units 41 to 48.

A pair of supporting column members 53a and 53b is arranged at both sides of the first and second transfer arms 52. The supporting column members 53a and 53b are extended from the bottom to the top of the second transfer section 15. Retreat spaces S1 and S2 capable of accommodating therein the first and second transfer arms 51 and 52 are formed in an upper portion and a lower portion of the second transfer section 15, respectively. The retreat space S1 is located at a position higher than the uppermost processing units 41 and 45, whereas the retreat space S2 is located at a position lower than the lowermost processing units 44 and 48.

Here, the second transfer device 50 in accordance with the example embodiment is configured such that movement ranges of the first transfer arm 51 and the second transfer arm 52 in the vertical direction are overlapped with each other.

Figure 4:
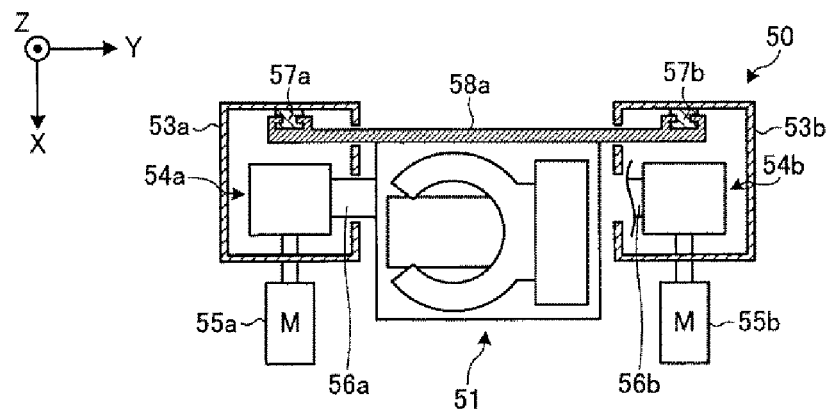
FIG. 4 is a schematic plane view illustrating a configuration of a second transfer device.
Figure 5:
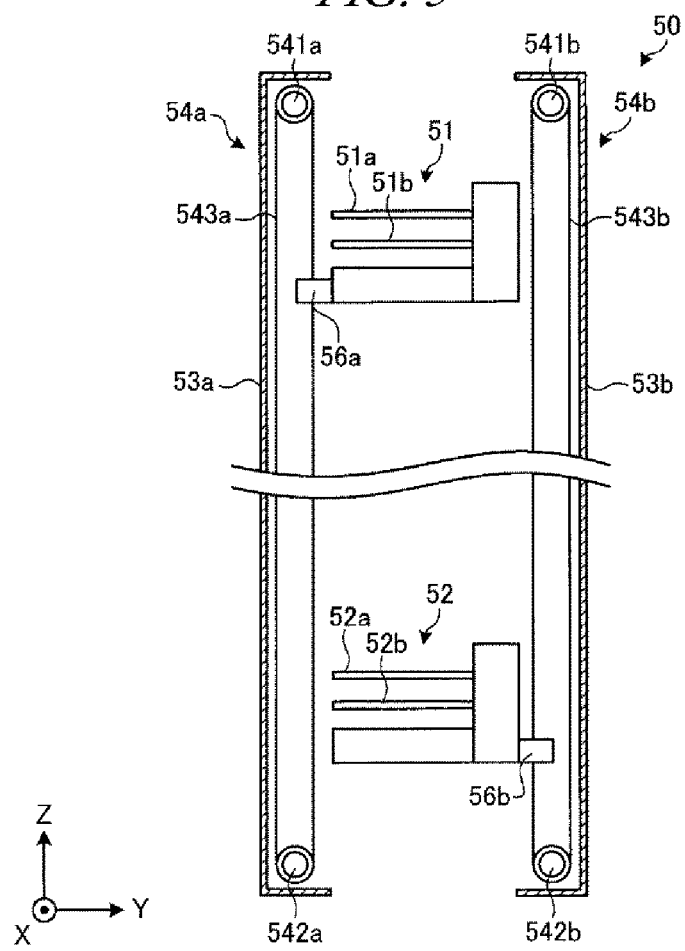
FIG. 5 is a schematic front view illustrating the configuration of the second transfer device.

Such a configuration of the second transfer device 50 will be elaborated with reference to FIG. 4 and FIG. 5. FIG. 4 is a schematic plane view illustrating the configuration of the second transfer device 50 and FIG. 5 is a schematic front view thereof.

As illustrated in FIG. 4 and FIG. 5, the second transfer device 50 includes the first transfer arm 51, the second transfer arm 52, the pair of supporting column members 53a and 53b, a first elevating device 54a, a second elevating device 54b, a first driving source 55a, a second driving source 55b, a first connection part 56a and a second connection part 56b.

Each of the first and second transfer arms 51 and 52 has a rotating member configured to be rotated about a vertical axis; an arm configured to be moved forward and backward; and a wafer holder provided at a leading end of the arm. Each of the first and second transfer arms 51 and 52 has a multiple number of (here, two) wafer holders. To elaborate, the first transfer arm 51 has two arms 51a and 51b, and the second transfer arm 52 has two arms 52a and 52b.

The first elevating device 54a is provided at one supporting column member 53a, and the second elevating device 54b is provided at the other supporting column member 53b. The first transfer arm 51 is connected to the first elevating device 54a via the first connection part 56a, and the second transfer arm 52 is connected to the second elevating device 54b via the second connection part 56b.

To elaborate, as depicted in FIG. 5, the first elevating device 54a includes a first pulley 541a provided at an upper portion of the supporting column member 53a; a second pulley 542a provided at a lower portion of the supporting column member 53a; and a belt 543a wound around the first pulley 541a and the second pulley 542a.

The first driving source 55a shown in FIG. 4 is connected to the second pulley 542a, and the first connection part 56a is connected to the belt 543a. The first elevating device 54a is configured as described above and moves the first transfer arm 51 in the vertical direction by converting a rotary motion of the first driving source 55a to a linear motion.

The second elevating device 54b also has the same configuration as that of the first elevating device 54a. Specifically, the second elevating device 54b includes a first pulley 541b, a second pulley 542b and a belt 543b accommodated in the supporting column member 53b as shown in FIG. 5. The second driving source 55b shown in FIG. 4 is connected to the second pulley 542b, and the second connection part 56b is connected to the belt 543b. The second elevating device 54b is configured as described above and moves the second transfer arm 52 in the vertical direction by converting a rotary motion of the second driving source 55b to a linear motion.

Further, the first driving source 55a and the second driving source 55b may be implemented by, but not limited to, motors. In addition, the first elevating device 54a and the second elevating device 54b may be composed of, but not limited to, ball screws.

Moreover, the second transfer device 50 also includes a pair of guide rails 57a and 57b and a connection member 58a.

The guide rails 57a and 57b are rail members extended in the vertical direction. One guide rail 57a is provided at the one supporting column member 53a, and the other guide rail 57b is provided at the other supporting column member 53b.

The first transfer arm 51 is connected to the pair of guide rails 57a and 57b via the connection member 58a. Further, the second transfer arm 52 is also connected to the pair of guide rails 57a and 57b via a connection member which is the same as the connection member 58a. With this configuration, the first transfer arm 51 and the second transfer arm 52 are moved upward and/or downward by the first elevating device 54a and the second elevating device 54b, respectively, while being guided on the pair of guide rails 57a and 57b.

As described above, the second transfer device 50 in accordance with the present example embodiment has the pair of supporting column members 53a and 53b covering at least the height range of the processing units 41 to 48. Further, the first elevating device 54a configured to move the first transfer arm 51 up and down is provided at the one supporting column member 53a and the second elevating device 54b configured to move the second transfer arm 52 up and down is provided at the other supporting column member 53b. With this configuration, the movement ranges of the first and second transfer arms 51 and 52 can be overlapped.

Further, in the present example embodiment, both of the first and second transfer arms 51 and 52 are capable of performing loading/unloading of the wafer W into/from all of the processing units 41 to 48. Meanwhile, the first transfer arm 51 may be configured to perform the loading/unloading of the wafer W into/from the processing units 41 to 43 and 45 to 47, whereas the second transfer arm 52 may be configured to perform the loading/unloading of the wafer W into/from the processing units 42 to 44 and 46 to 48, for example.

In the second transfer device 50 in accordance with the present example embodiment, the pair of supporting column members 53a and 53b are shared by the first and second transfer arms 51 and 52. Thus, cost of the second transfer device 50 can be reduced and increase of footprint of the substrate processing apparatus 1 can be suppressed.

Figure 6:
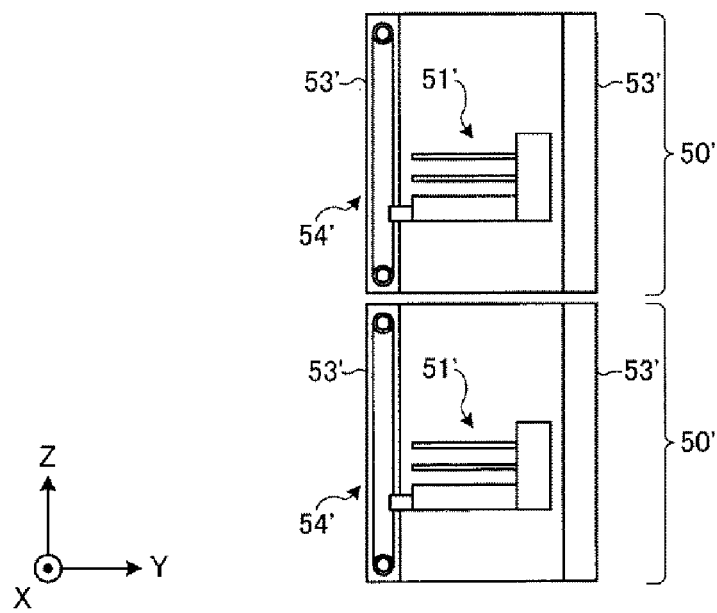
FIG. 6 is a schematic front view illustrating a configuration of a conventional substrate transfer device.

Here, a configuration of a conventional substrate transfer device will be explained with reference to FIG. 6. FIG. 6 is a schematic front view illustrating a configuration of the conventional substrate transfer device.

As depicted in FIG. 6, a conventional substrate transfer device 50' includes a single transfer arm 51', a pair of supporting column members 53' and 53', and a single transfer device 54'. In a conventional substrate processing apparatus, these substrate processing devices 50' are arranged vertically in two levels.

In this configuration of the conventional substrate processing apparatus, the movement ranges of the two transfer arms 51' are limited within the upper portion and the lower portion of the transfer section, respectively. Therefore, in case that the transfer arm 51' at the upper side is out of order, all the processing units arranged at the upper side cannot be used, so that the throughput is deteriorated.

On the contrary, in the substrate processing apparatus 1 in accordance with the present example embodiment, since the movement ranges of the two transfer arms 51 and 52 are overlapped, one of the transfer arms 51 and 52 can be moved within the movement range of the other transfer arm. As a result, it is possible to suppress the throughput from being reduced even if a problem occurs in any one of the transfer arms 51 and 52.

Figure 7:
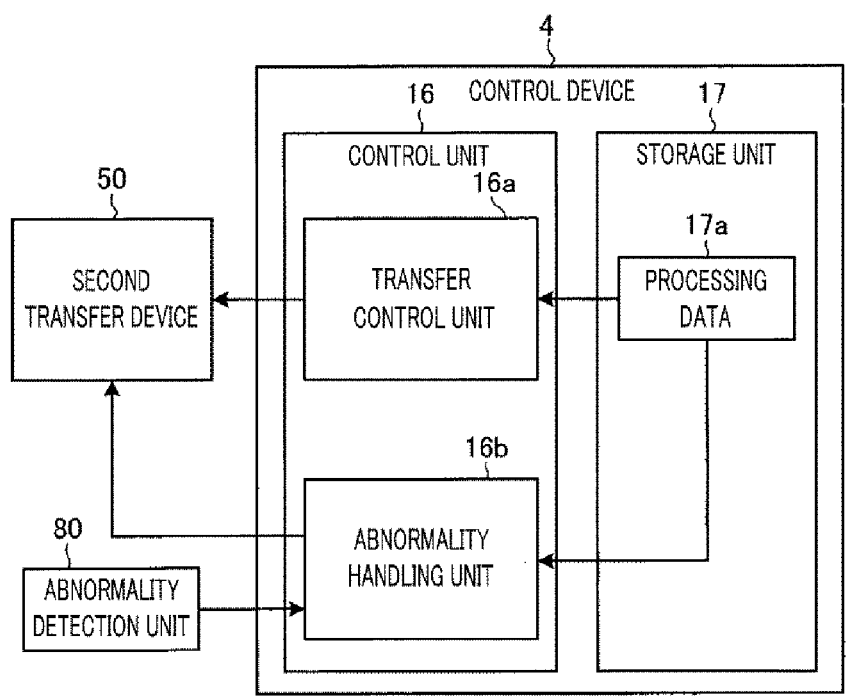
FIG. 7 is a block diagram illustrating a configuration of a control device.

Now, a configuration of the control device 4 will be elaborated with reference to FIG. 7. FIG. 7 is a block diagram illustrating a configuration of the control device 4. In FIG. 7, only constituent components required to explain the characteristics of the control device 4 are depicted, and illustration of general constituent components is omitted.

As depicted in FIG. 7, the control device 4 includes a control unit 16 and a storage unit 17. The control unit 16 includes a transfer control unit 16a and an abnormality handling unit 16b. The storage unit 17 stores therein processing data 17a.

The control unit 16 may be, but not limited to, a CPU (Central Processing Unit). The control unit 16 reads out non-illustrated programs from the storage unit 17 and executes them to serve as the transfer control unit 16a and the abnormality handling unit 16b. Further, the control unit 16 may be composed of hardware only without using programs.

Further, the substrate processing apparatus 1 includes an abnormality detection unit 80. In the present example embodiment, the abnormality detection unit 80 is configured to detect abnormality in the driving systems of the first transfer arm 51 and the second transfer arm 52. To elaborate, the abnormality detection unit 80 detects abnormalities in the extending and contracting motion, the vertically moving motion and the rotating motion about the vertical axis. When an abnormality is detected, the abnormality detection unit 80 outputs the detection result to the abnormality handling unit 16b of the control unit 16.

In the present example embodiment, the abnormality detection unit 80 is provided outside the control device 4. However, it may be also possible to allow the control unit 16 to perform the same process as that of the abnormality detection unit 80. To be specific, the control unit 16 may determine whether the second transfer device 50 has well operated according to an instruction based on a difference between an operation instruction outputted to the second transfer device 50 and operation result information inputted from the second transfer device 50. If not, the control unit 16 may output the detection result notifying the abnormality.

The transfer control unit 16a controls an operation of the second transfer device 50 based on the processing data 17a stored in the storage unit 17.

The transfer control unit 16a assigns the processing units 41 to 48 to the first transfer arm 51 and the second transfer arm 52, respectively, such that the processing units located at the same height positions are covered by the single transfer arm. By way of example, in the present example embodiment, the upper four processing units 41, 42, 45 and 46 among the processing units 41 to 48 are assigned to the first transfer arm 51, whereas the lower four processing units 43, 44, 47 and 48 are assigned to the second transfer arm 52. The first transfer arm 51 is capable of loading and unloading the wafers W into/from the processing units 41, 42, 45 and 46 sheet by sheet by using the two arms 51a and 51b. Likewise, the second transfer arm 52 is capable of loading and unloading the wafers W into/from the processing units 43, 44, 47 and 48 sheet by sheet by using the two arms 52a and 52b.

The transfer control unit 16a controls the first transfer arm 51 to perform the loading/unloading of the wafers W into/from the processing units 41, 42, 45 and 46, and controls the second transfer arm 52 to perform the loading/unloading of the wafers W into/from the processing units 43, 44, 47 and 48.

The abnormality handling unit 16b performs an abnormality handling process in case of receiving an abnormality occurrence notification from the abnormality detection unit 80. Here, the abnormality handling process will be described with reference to FIG. 8 and FIG. 9.

Figure 8:
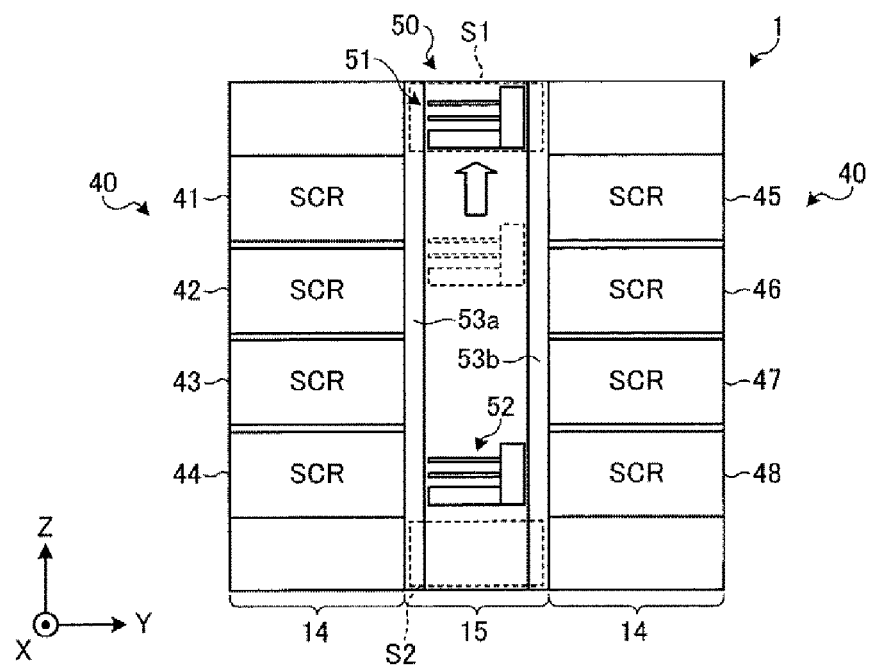
FIG. 8 is a diagram illustrating an example operation of an abnormality handling process.
Figure 9:
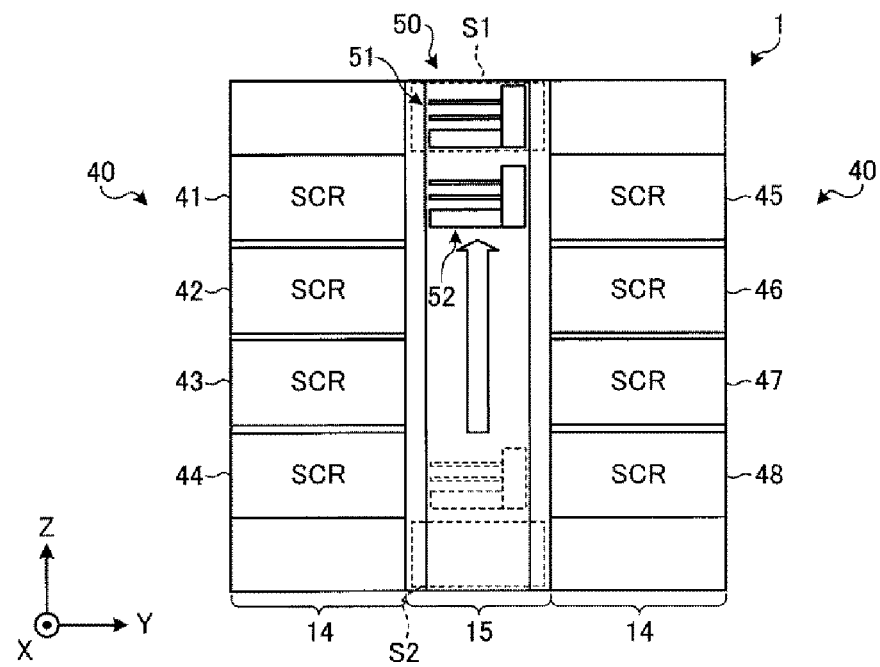
FIG. 9 is a diagram illustrating an example operation of the abnormality handling process.

FIG. 8 and FIG. 9 are diagrams illustrating example operations of the abnormality handling process. Specifically, FIG. 8 and FIG. 9 depict example operations of the abnormality handling process in case that an abnormality of the first transfer arm 51 has occurred.

As depicted in FIG. 8, if the abnormality of the first transfer arm 51 is detected by the abnormality detection unit 80, the abnormality handling unit 16b moves the first transfer arm 51 to the retreat space 51 by controlling the second transfer device 50.

Here, the first transfer arm 51 is moved into the retreat space 51 when detecting an abnormality in the extending/contracting motion or the rotating motion about the vertical axis of the first transfer arm 51. In case that an abnormality in the vertically moving motion of the first transfer arm 51 is detected, that is, in case that the first elevating device 54a or the first driving source 55a is out of order, the first transfer arm 51 cannot be moved into the retreat space S1.

Subsequently, after moving the first transfer arm 51 into the retreat space 51, based on the processing data 17a, the abnormality handling unit 16b controls the second transfer device 50 to allow the second transfer arm 52 to perform the operation scheduled to be performed by the first transfer arm 51. That is, the abnormality handling unit 16b allows the second transfer arm 52 to perform the loading/unloading of the wafers W into/from the processing units 41, 42, 45 and 46 as well, which is originally supposed to be conducted by the first transfer arm 51 (see FIG. 9).

At this time, since the first transfer arm 51 is moved into the retreat space S1, the second transfer arm 52 is capable of performing the loading/unloading of the wafers W into/from the processing units 41, 42, 45 and 46 without being interfered by the first transfer arm 51.

Further, if an abnormality in the vertically moving motion of the first transfer arm 51 is detected, the abnormality handling unit 16b may allow the second transfer arm 52 to perform the loading/unloading of the wafers W into/from the processing units 41 to 48 located below the current position of the first transfer arm 51 (for example, the processing units 42 to 44 and 46 to 48 when the first transfer arm 51 is stopped in front of the processing unit 41).

Figure 10:
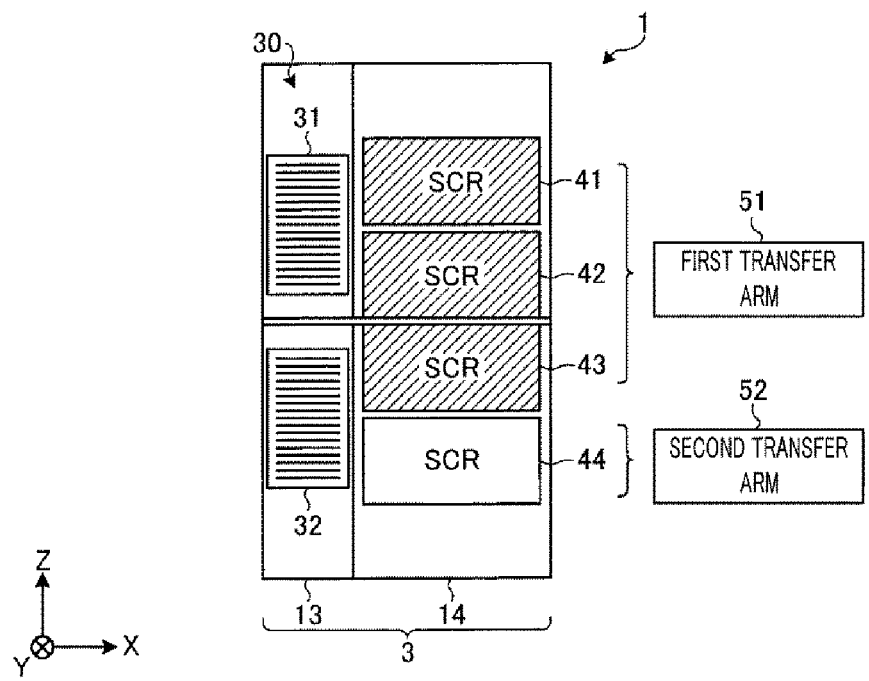
FIG. 10 is a diagram illustrating an example of assignment of processing units to a first transfer arm and a second transfer arm.

Meanwhile, in the substrate processing apparatus 1 in accordance with the present example embodiment, different numbers of processing units 41 to 48 may be assigned to the first transfer arm 51 and the second transfer arm 52, as will be elaborated below with reference to FIG. 10. FIG. 10 is a diagram illustrating an example of the processing units 41 to 48 assigned to the first transfer arm 51 and the second transfer arm 52, respectively.

As shown in FIG. 10, for example, the transfer control unit 16a of the control unit 16 may assign the processing units 41 to 43 and 45 to 47 to the first transfer arm 51 and may assign the processing units 44 and 48 to the second transfer arm 52.

Here, in the conventional substrate processing apparatus, it is also possible to assign different numbers of processing units with respect to wafers having a long processing time and wafers having a short processing time, respectively. In the conventional substrate processing apparatus, however, since the vertical movement ranges of the two transfer arms are limited within the upper portion and the lower portion of the transfer section, respectively, a single transfer arm is required to handle both of the wafers having the long processing time and the wafers having the short processing time if the assignment numbers of the processing units are set to be different for these wafers with the long processing time and the short processing time. As a result, a transfer schedule may be complicated, and the transfer of the wafers having the short processing time may be delayed by the transfer of the wafers having the long processing time.

In contrast, in the second transfer device 50 in accordance with the present example embodiment, the vertical movement ranges of the first transfer arm 51 and the second transfer arm 52 are overlapped with each other. Accordingly, even if the assignment numbers of the processing units 41 to 48 are set to be different for the wafers W having the long processing time and the wafers W having the short processing time, the first transfer arm 51 can be controlled to transfer only the wafers W having the long processing time, whereas the second transfer arm 52 can be controlled to transfer only the wafers W having the short processing time.

Thus, in the substrate processing apparatus 1 in accordance with the present example embodiment, delay of the transfer of the wafers W having the short processing time by the transfer of the wafers W having the long processing time, or vice versa can be reduced. Hence, even when two kinds of wafers W having different processing times are used, the throughput can be improved. Also, the complication of transfer schedule can be avoided.

Further, in the substrate processing apparatus 1 in accordance with the present example embodiment, one or more additional processing blocks 3 can be connected to the processing block 3 (shown in FIG. 1). As the substrate processing apparatus 1 has the plural number of processing blocks 3, the assignment number of processing units 41 to 48 for the respective transfer arms 51 and 52 can be set more minutely.

Figure 11:
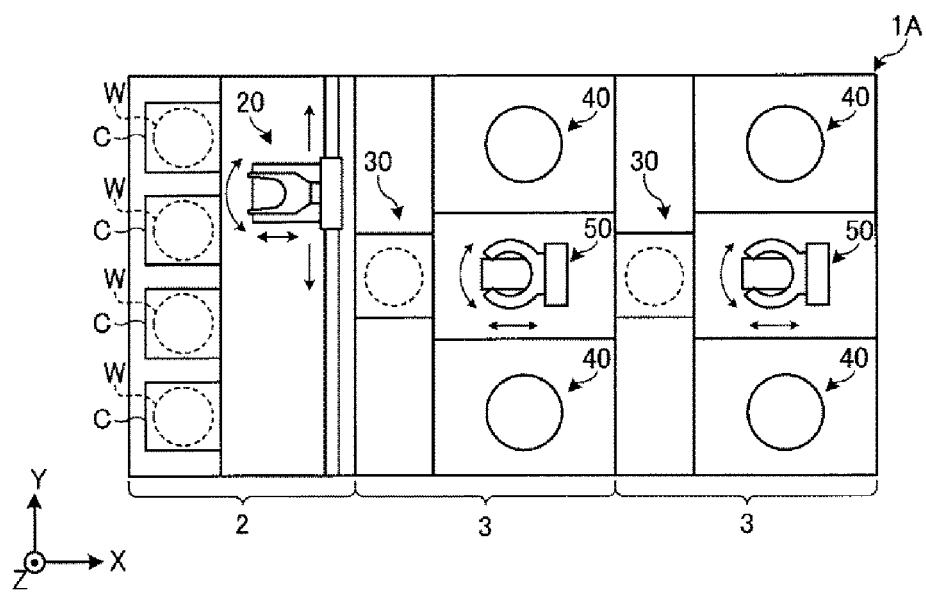
FIG. 11 is a schematic plane view illustrating a configuration of a substrate processing apparatus in accordance with a modification example.
Figure 12:
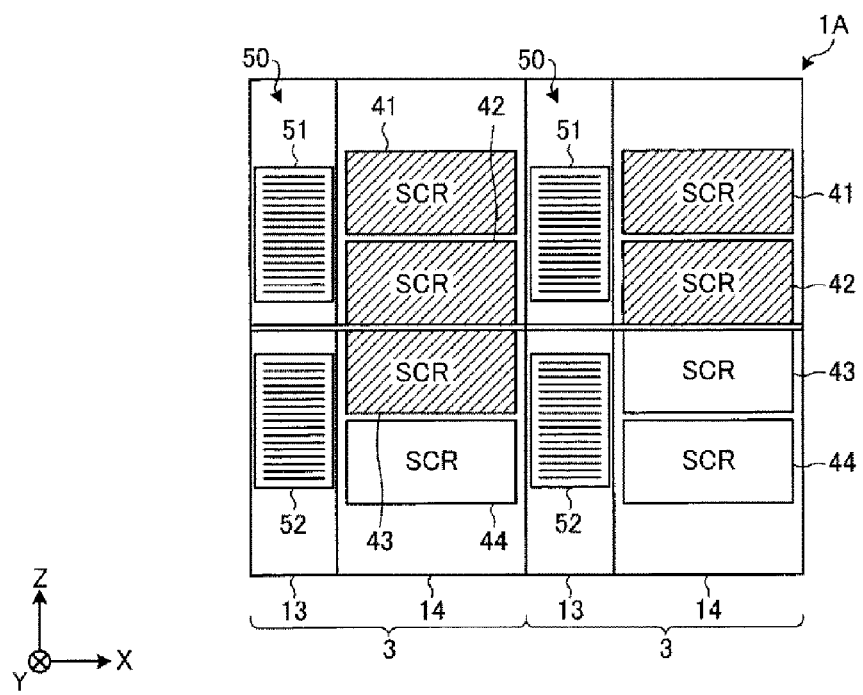
FIG. 12 is a diagram illustrating another example of assignment of processing units to a first transfer arm and a second transfer arm.

This configuration will be elaborated with reference to FIG. 11 and FIG. 12. FIG. 11 is a schematic plane view illustrating a configuration of a substrate processing apparatus in accordance with a modification example. In the following description, the same parts as already described above will be assigned same reference numerals, and redundant description will be omitted.

As shown in FIG. 11, a substrate processing apparatus 1A in accordance with the modification example includes a loading/unloading block 2 and two processing blocks 3. These blocks are connected in the order of the loading/unloading block 2, the processing block 3 and the processing block 3. A second transfer device 50 belonging to the processing block 3 at a front side (negative X-axis side) is configured to the transfer wafer W between an accommodation unit 30 at the front side and a processing unit 40 at the front side and, also, between the processing unit 40 at the front side and the accommodation unit 30 at a rear side (positive X-axis side). Further, in the configuration where the plural number of processing blocks 3 are connected as in the substrate processing apparatus 1A, the wafers W are first transferred to processing units 41 to 48 of the innermost processing block 3 (here, the processing block 3 at the rear side).

FIG. 12 is a diagram illustrating another example of the processing units 41 to 48 assigned to a first transfer arm 51 and a second transfer arm 52, respectively. Here, in FIG. 12, the processing units assigned to the first transfer arm 51 are indicated by hatching.

As shown in FIG. 12, a transfer control unit 16a of a control unit 16 assigns the processing units 41 to 43 and 45 to 47, among the processing units 41 to 48 belonging to the processing block 3 at the front side, to the first transfer arm 51 at the front side, and assigns the other processing units 44 and 48 to the second transfer arm 52 at the front side. Further, the transfer control unit 16a assigns the processing units 41, 42, 45 and 46 to the first transfer arm 51 at the rear side, among the processing units 41 to 48 belonging to the processing block 3 at the rear side, and assigns the other processing units 43, 44, 47 and 48 to the second transfer arm 52 at the rear side.

In such a case, the ratio of the assignment numbers of the processing units 41 to 48 to the first transfer arm 51 and the second transfer arm 52 is 5:3. Further, in the substrate processing apparatus 1A, by increasing the number of processing blocks 3 connected to each other, the assignment numbers of the processing units 41 to 48 can be more minutely set. Thus, in case that two kinds of wafers having different processing times are used, for example, it is possible to set optimal assignment numbers of the processing units according to the processing times, so that the throughput can be further improved.

As stated above, the substrate processing apparatus 1 in accordance with the example embodiment includes the multiplicity of processing units 41 to 48 and the second transfer device 50. The multiplicity of processing units 41 to 48 are arranged in the vertical direction and configured to process wafers W therein. The second transfer device 50 is configured to be moved in the vertical direction and perform the loading/unloading of the wafers W into/from the processing units 41 to 48. Further, the second transfer device 50 includes the first transfer arm 51 and the second transfer arm 52 arranged in the vertical direction and configured to be moved in the vertical direction independently. The movement range of the two transfer arms 51 and 52 in the vertical direction are overlapped with each other. In accordance with the substrate processing apparatus 1 having the above-described configuration, the throughput can be improved.

Further, in the above-described example embodiment, the pair of supporting column members 53a and 53b are commonly shared by the first transfer arm 51 and the second transfer arm 52. However, the pair of supporting column members 53a and 53b may not necessarily be shared. That is, two pairs of supporting column members 53a and 53b may be provided. In this case, the first transfer arm 51 and the first elevating device 54a may be installed at one of the two pairs, and the second transfer arm 52 and the second elevating device 54b may be installed at the other of the two pairs.

Furthermore, in the above-described example embodiment, the processing units 41 to 48 are assigned to the first transfer arm 51 and the second transfer arm 52, respectively, such that the processing units located at the same height positions are covered by the single transfer arm. However, the example embodiment may not be limited thereto, and the transfer control unit 16a may assign one of the processing units located at the same height position to the first transfer arm 51 and may assign the other to the second transfer arm 52, respectively.

By way of example, the transfer control unit 16a may assign, among the processing units 41 to 48, the processing units 41 to 43, 45 and 46 to the first transfer arm 51 and may assign the rest processing units 44, 47 and 48 to the second transfer arm 52. In such a case, of the two processing units 43 and 47 located at the same height position, the processing unit 43 is assigned to the first transfer arm 51, whereas the processing unit 47 is assigned to the second transfer arm 52.

As stated above, if the different processing units located at the same height position are assigned to the first transfer arm 51 and the second transfer arm 52, respectively, the assignment numbers of the processing units 41 to 48 can be set more minutely.

Further, in the above-described example embodiment, the loading/unloading of the wafers W into/from the processing units 41 to 48 are performed by using both of the first and second transfer arms 51 and 52. However, the example embodiment may not be limited thereto. By way of example, when a processing time is extremely longer than a transfer time, the transfer control unit 16a may set the number of processing units 41 to 48 assigned to one of the two transfer arms to be 0 (zero) and assign all of the processing units 41 to 48 to the other transfer arm. In this case, since only the other transfer arm performs the loading/unloading of the wafers W into/from the processing units 41 to 48, power consumption can be reduced, as compared to the case of using both transfer arms.

In addition, by referring to the processing data 17*a* stored in the storage unit 17, the transfer control unit 16*a* may switch from a mode in which the loading/unloading of the wafers W are performed by using two transfer arms into a mode in which the loading/unloading of the wafers W are performed by using one transfer arm when a processing time in each of the processing units 41 to 48 exceeds a preset threshold value.

Other inventive effects or modification examples may be easily conceived by those skilled in the art. From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

We claim:

1. A substrate processing apparatus, comprising:
processing units arranged in a vertical direction and configured to process substrates;
a substrate transfer device configured to be moved in the vertical direction and perform loading/unloading of the substrates into/from the processing units;
a control unit configured to control the substrate transfer device; and
an abnormality detection unit configured to detect an abnormality of the substrate transfer device,
wherein the substrate transfer device comprises a first transfer arm and a second transfer arm which are arranged in the vertical direction and configured to be moved in the vertical direction independently, and movement ranges of the first transfer arm and the second transfer arm in the vertical direction are overlapped with each other,
the substrate transfer device further comprises:
a pair of supporting column members provided such that the first transfer arm and the second transfer arm are positioned between the pair of supporting column members; and
a pair of guide rails provided at the pair of supporting column members, respectively, and configured to guide vertically moving motions of the first transfer arm and the second transfer arm, and
wherein the pair of supporting column members are shared by the first transfer arm and the second transfer arm,
retreat spaces, in which the first transfer arm and the second transfer arm are allowed to be accommodated, are provided above the uppermost processing unit and below the lowermost processing unit, respectively,
when the abnormality detection unit detects an abnormality in an extending/contracting motion or a rotating motion of the first transfer arm or the second transfer arm, the control unit controls the substrate transfer device to move one of the first transfer arm and the second transfer arm, in which the abnormality is detected, into the retreat space, and controls the other of the first transfer arm and the second transfer arm to perform the loading/unloading of the substrates into/from the processing units, which is originally scheduled to be performed by the one of the first transfer arm and the second transfer arm, and
when the abnormality detection unit detects an abnormality in a vertically moving motion of the first transfer arm or the second transfer arm, the control unit controls one of the first transfer arm and the second transfer arm, in which the abnormality is not detected, to perform the loading/unloading of the substrates into/from processing units located below or above a current position of the other of the first transfer arm and the second transfer arm, in which the abnormality is detected.

2. The substrate processing apparatus of claim 1,
wherein the substrate transfer device further comprises:
a first elevating device provided at one of the pair of supporting column members, and configured to move the first transfer arm in the vertical direction; and
a second elevating device provided at the other of the pair of supporting column members, and configured to move the second transfer arm in the vertical direction.

3. The substrate processing apparatus of claim 1,
wherein the total number of the processing units is larger than the total number of the first transfer arm and the second transfer arm.

4. The substrate processing apparatus of claim 1,
wherein the first transfer arm and the second transfer arm perform the loading/unloading of the substrates into/from the processing units assigned thereto, and
the processing units located at the same height position are assigned to the first transfer arm and the second transfer arm, respectively.

5. The substrate processing apparatus of claim 1,
wherein the first transfer arm and the second transfer arm perform the loading/unloading of the substrates into/from the processing units assigned thereto, and
the number of the processing units assigned to the first transfer arm is set to be different from the number of the processing units assigned to the second transfer arm.

6. The substrate processing apparatus of claim 1, comprising:
processing blocks, each having the processing units and the substrate transfer device, allowed to be connected with each other.

* * * * *

UNITED STATES PATENT AND TRADEMARK OFFICE
CERTIFICATE OF CORRECTION

PATENT NO. : 9,666,463 B2
APPLICATION NO. : 14/580703
DATED : May 30, 2017
INVENTOR(S) : Katsuhiro Morikawa et al.

Page 1 of 1

It is certified that error appears in the above-identified patent and that said Letters Patent is hereby corrected as shown below:

In the Specification

Column 8, Line 2, replace "51" with -- S1 --. (Second Occurrence)

Column 8, Line 5, replace "51" with -- S1 --.

Column 8, Line 13, replace "51" with -- S1 --.

Signed and Sealed this
Thirty-first Day of October, 2017

Joseph Matal
*Performing the Functions and Duties of the
Under Secretary of Commerce for Intellectual Property and
Director of the United States Patent and Trademark Office*